Feb. 7, 1956 J. I. PANKOVE 2,734,154

SEMICONDUCTOR DEVICES

Filed July 27, 1953

INVENTOR.
Jacques I. Pankove

BY J. L. Whittaker

ATTORNEY

United States Patent Office 2,734,154

Patented Feb. 7, 1956

2,734,154

SEMICONDUCTOR DEVICES

Jacques I. Pankove, Princeton, N. J., assignor to Radio Corporation of America, a corporation of Delaware Application July 27, 1953, Serial No. 370,267

14 Claims. (Cl. 317—235)

This invention relates to semiconductor devices such as transistors and particularly to an improved electrode construction for such devices.

A typical transistor comprises a body of semiconductor material, germanium, silicon or the like, having a base electrode and emitter and collector rectifying electrodes in contact therewith. In operation of such a transistor, the emitter injects minority charge carriers into the semiconductor body and these carriers flow to the collector electrode. An amplified output signal appears in the collector circuit representative of the charge injection from the emitter, and responsive to variations of the signal voltage applied to the base or emitter electrode.

In one transistor construction, the emitter and collector electrodes may be fine wires which make small-area line or point contact with a surface of the semiconductor body.

Since, in such devices, the electrodes are ordinarily fine wires of the order of one mil or so in diameter, it is difficult to apply pressure to the wires without distorting them. Furthermore, since the electrodes associated with these devices are of comparatively small size, proper heat dissipation is often difficult to achieve.

In addition, the small area electrode contact with the crystal surface may take the form of a line, a point, an annulus or the like. Such contact areas are comparatively difficult to achieve with components of the size employed in transistor construction.

Accordingly, one object of this invention is to provide a semiconductor device of new and improved construction.

Another object of this invention is to provide a transistor having a new and improved electrode construction.

A further object of this invention is to provide an improved transistor having improved means for dissipating heat.

Another object of this invention is to provide an improved transistor having electrodes in contact with a semiconductor crystal, the area of contact and the pressure of contact being readily controlled.

In general, the purposes and objects of this invention are accomplished by the provision of fluid electrodes, for example quantities of mercury, in rectifying contact with a semiconductor crystal. The area of contact and the pressure of contact of such electrodes are readily controlled.

The invention is described in greater detail by reference to the drawing wherein.

Similar elements are designated by similar reference characters throughout the drawing.

Figures 1, 2, 3, 4, 5, 6, 7, 8, 9, 10:
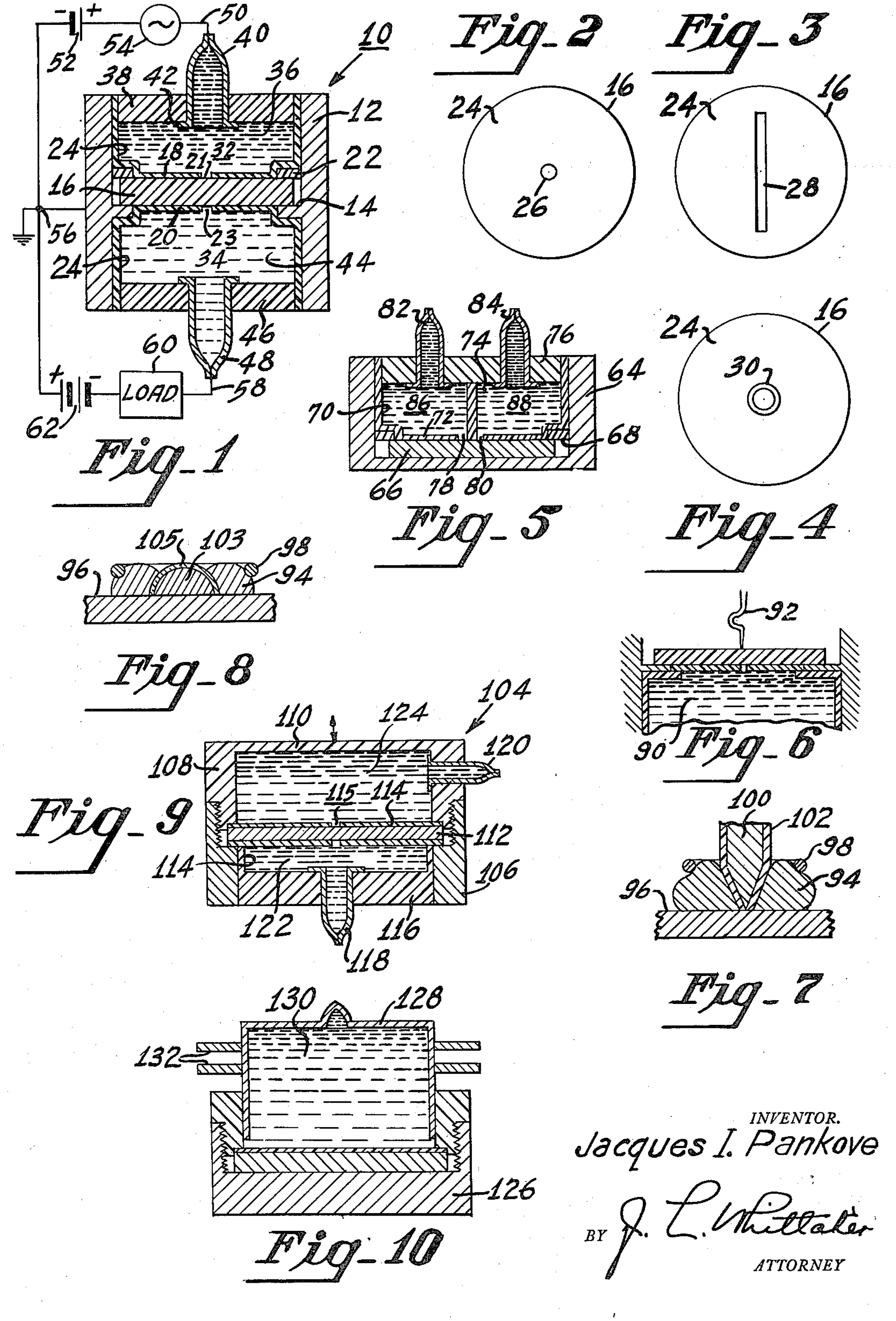
Fig. 1 is a sectional, elevational view of a device embodying the principles of the invention and a schematic representation of a circuit in which the device may be operated.
Fig. 2 is a plan view of a semiconductor crystal prepared for use in a device of the invention.
Fig. 3 is a plan view of a first modification of the crystal shown in Fig. 2.
Fig. 4 is a plan view of a second modification of the crystal shown in Fig. 2.
Fig. 5 is a sectional, elevational view of a second embodiment of apparatus constructed according to the principles of the invention.
Fig. 6 is a fragmentary sectional, elevational view of a third embodiment of the invention.
Fig. 7 is a fragmentary elevational view, partly in section, of a fourth embodiment of the invention.
Fig. 8 is a fragmentary elevational view, partly in section, of a modification of the device shown in Fig. 7.
Fig. 9 is a sectional, elevational view of a fifth embodiment of the invention; and, Fig. 10 is a sectional, elevational view of a sixth embodiment of the invention.

Referring to Figure 1, a device 10, according to the invention, includes a metallic housing 12, for example, of nickel and of cylindrical or other cross-section, having an inwardly projecting rib 14. Alternatively, the housing may comprise insulating material and the rib 14 may be a metallic ring mounted therein. If an insulating housing is employed, one or more apertures or other means are provided for making electrical connection to the metallic ring. For the purposes of this description, the housing will be assumed to be of metal.

A semiconductor crystal 16, for example, of germanium or silicon or the like, of N-type or P-type conductivity, is positioned on the rib 14. In the following description, the crystal will be assumed to be of N-type germanium. The crystal 16 may conveniently be in the form of a disk having two surfaces 18 and 20 which may be planer and parallel. The surfaces 18 and 20 may also be provided with concentric depressions to allow close spacing of electrodes to be connected thereto. An insulating ring 22, of rubber or the like, is positioned on the crystal to provide a force for maintaining the crystal in position and in good electrical contact with the rib 14 which functions as the base electrode in the completed device.

A coating of insulating material 24, for example varnish, lacquer or plastic, or, specifically, a solution of polystyrene in toluol, is provided over the entire germanium crystal 16, and the inner surface of the housing 12.

The insulating coating 24 on the surfaces 18 and 20 of the crystal 16 is treated to allow access to small surface portions of the crystal for the purpose of making electrical connection thereto. To this end, the coating is removed from the surfaces 18 and 20 by means of a sharp probe or the like to expose small portions 21, 23 of the respective surfaces. The exposed surface areas 21, 23 may take several forms. For example, referring to Figure 2, an exposed area 26 may be circular and of the order of one mil in diameter. Referring to Figure 3, an exposed area 28 may be in the form of a line of the order of one mil wide. Alternatively, referring to Figure 4, a cleared area 30 may be in the form of a ring. Substantially any desired shape of crystal contact area may be formed.

With the crystal 16 in place, the housing 12 is effectively divided into two chambers 32 and 34. Next, according to the invention, one chamber, e. g. 32 is filled with a quantity 36 of mercury or gallium or some other conductive liquid adapted to wet the exposed surface of the crystal and to provide intimate electrical contact therewith without chemically reacting therewith. The liquid will be assumed to be mercury. The chamber is completely filled with mercury and the size of the chamber is designed to provide the desired contact pressure on the crystal surface.

After the mercury 36 has been introduced into the chamber 32, an insulating disk 38 of rubber or the like is inserted into the open end of the housing in air-tight, liquid-tight engagement therewith. The disk 38 is provided with an aperture which is provided with a short length of hollow metal, for example nickel, tubing 40 which is held in liquid-tight engagement with the disk, for example by means of a flanged portion 42. The chamber 32 is filled through the tubing 40 and the tube is pinched off.

The chamber 34 is similarly filled with mercury 44 and closed by a disk 46 having a piece of metal tubing 48 which is also appropriately pinched off. Thus the crystal is provided with two electrodes, the quantities of mercury 36 and 44, which are in small area, rectifying contact with the surfaces 18 and 20 respectively.

The mercury electrodes 36 and 44 have the advantages of providing good electrical contact with the crystal, ease of handling, providing contact pressure which may be readily controlled and promoting heat dissipation through the walls of the housing 12. If by chance, the device should overheat and the mercury should expand, then the other components should also expand sufficiently to retain the desired operating characteristics.

In operation of the device 10, as a transistor, one of the quantities of mercury, e. g. 36 is operated as the emitter electrode and the other 44 is operated as the collector electrode. The housing 12, by means of the rib 14 on which the crystal rests, acts as a base electrode. To operate the mercury electrode 36 as the emitter, the tubing 40 which acts as an electrode connection to the mercury is biased in the forward direction with respect to the crystal 16 by a lead 50 connected to the positive terminal of a battery 52, the negative terminal of which is connected to ground and to a connection 56 to the base electrode housing. A signal source 54 is also provided in series with the battery 52.

The mercury collector electrode 44 is biased in the reverse direction with respect to the crystal 16 by means of a lead 58 to the negative terminal of a battery 62, the positive terminal of which is connected to ground. A load device 60 is also provided in the collector circuit. If the crystal were P-type germanium the bias voltages would be reversed.

In operation of the device 10 as a transistor, the mercury emitter 36 injects minority charge carriers, in this case, holes, into the crystal 16 under the control of a signal from the source 54. The charge carriers diffuse to the collector 44 and an amplifed output signal appears in the collector circuit.

As a modification of the invention shown in Figure 1 only one chamber may be filled with a mercury electrode and the device may thereby be operated as a diode. In addition, if only one mercury electrode, e. g. 36, is provided and the surface 20 of the crystal 16 is properly cleaned and etched, the device may be operated as a photocell with light or other radiation reaching the surface 20 through the open chamber 44. Alternatively, in a photocell, the chamber 34 may be filled with a medium transparent in a selected spectral region, e. g. water, an electrolyte or the like which would be substituted for the mercury 44 and closed with a transparent plug of glass, plastic or the like.

Referring to Figure 5, a device comprising a second embodiment of the invention includes a metallic housing 64 which may be in the form of a hollow cylinder having a closed end which supports a semiconductor crystal 66. An insulating washer 68 retains the crystal 66 in the desired position. An insulating coating 70 is provided on the crystal 66 and on the inner wall of the housing 64. The portion of the coating 70 on the surface of the crystal is provided with an opening 72 exposing a circular or rectangular portion of the semiconductor crystal surface as in the devices of Figures 2 and 3. The interior of the housing and the opening 72 are divided into two portions by a thin insulating spacer 74 of mica or the like of the order of one mil thick. The exposed surface of the crystal is thus separated into two separate mercury electrode contact areas 78 and 80 which are insulated from each other. An insulating closure disk 76 is provided with two electrode contact leads 82 and 84 for making electrical connection to the separate pools of mercury 86 and 88 enclosed in the separate portions of the housing 64.

Thus the device of Figure 5 effectively is provided with two closely spaced point or line contact electrodes on the same surface of the crystal. In addition, the housing and crystal contact surface chamber may be further subdivided into three or more isolated portions by means of a properly designed spacer to provide a plurality of such fluid contacts on the semiconductor crystal surface.

If desired, one chamber of the device 10 shown in Figure 1 may be subdivided as is the chamber in the device shown in Figure 5. A portion of a device embodying a further embodiment of the invention is shown in Figure 6. In this device, one mercury contact electrode 90 and one wire point contact electrode 92 are provided. This may take the form shown in Figure 7 wherein a drop of mercury 94 is positioned on a surface of a semiconductor crystal 96 and is restrained thereon by a metallic loop 98. A sharply pointed wire 100 having a coating of insulating material 102 covering the wire except the apex of the point, is introduced point first into the mercury droplet until the point contacts the crystal surface. Thus two separate, closely spaced rectifying electrodes are provided in contact with the crystal 96. This close spacing provides improved high frequency operation.

In operation, the pointed wire 100 may be operated as an emitter electrode and the mercury droplet 94 as a collector electrode. In an alternative construction shown in Figure 8, the point electrode 92 may be replaced by a P-N junction electrode 103 provided with a protective coating 105 of lacquer or the like.

The principles of the invention may also be applied to a semiconductor transducer. Referring to Figure 9, such a transducer 104 comprises a hollow cylindrical metallic housing member 106 threadedly or otherwise tightly engaged with a similar hollow, cylindrical insulating housing member 108 having a thin resilient wall 110 closing one end thereof. A semiconductor crystal 112 is held rigidly between the members. Both surfaces of the crystal are coated with insulating material 114 except for selected exposed areas 115, 117 to which electrical contact is to be made by means of mercury electrodes. The exposed inner surface of the metallic housing 106 is similarly insulated.

An insulating disk 116 having an electrode contact tube 118 in liquid-tight engagement therewith is provided to close the open end of the cylinder 106. The cylinder 108 is also provided with a metallic electrode contact tube 120 in the side wall thereof. When the various parts of the transducer device are assembled the cylinders 106 and 108 are filled with quantities of mercury 122, 124 which make rectifying contact with the semiconductor crystal.

In operation of the device 104 as a transducer, the mercury electrode 124, for example is operated as the emitter and the mercury 122 is operated as the collector. The thin resilient wall portion 110 of the cylinder 108 is connected to some suitable means for applying mechanical force thereto, for example, the movable diaphragm of a microphone. As varying mechanical forces are applied to the resilient wall 110 as indicated by the arrow, the contact pressure of the mercury electrode 124 on the crystal changes and the current output of the device varies accordingly.

According to the invention, the device shown in Figure 10 embodies certain features which may be employed where appropriate and desirable in any of the foregoing devices. For example, in a diode construction, the base electrode may comprise a solid metal plug 126 of copper or the like to provide improved heat radiation. In addition, where appropriate, to further promote heat radiation, a housing closure member may comprise a metallic, e. g. copper, cylinder 128 having large surface area in contact with a mercury electrode 130 and provided with heat radiating fins 132.

What is claimed is:

1. A semiconductor device comprising a body of semiconductor material and at least one electrode in rectifying contact with said body, said electrode comprising a conductive fluid.

2. The device set forth in claim 1 wherein said electrode comprises a metallic fluid.

3. The device set forth in claim 2 wherein said metallic fluid is a member of the group consisting of mercury and gallium.

4. A semiconductor device comprising a body of semiconductor material, a quantity of a conductive fluid in rectifying contact with said body, and an electrode penetrating through said conductive fluid and in contact with said body, said electrode being insulated from said fluid.

5. A semiconductor device comprising a housing, a semiconductor crystal mounted within said housing and dividing said housing into two separate chambers, and a quantity of conductive fluid in at least one of said chambers and in rectifying contact with a surface portion of said crystal.

6. The device set forth in claim 4 and including at least one other electrode in rectifying contact with said crystal.

7. The device set forth in claim 6 wherein said other electrode comprises a small-area wire.

8. A semiconductor device comprising a housing, a semiconductor crystal mounted within said housing and dividing said housing into two separate chambers, and quantities of conductive fluid in said chambers and in rectifying contact with said crystal.

9. The device set forth in claim 8 and including a closure member for each of said chambers.

10. A semiconductor device comprising a housing, a semiconductor crystal mounted within said housing and dividing said housing into two separate chambers, closure members for said chambers, and a quantity of conductive fluid in at least one of said chambers and in rectifying contact with said crystal, said closure members having means adapted to make electrical contact to said conductive liquid.

11. The device set forth in claim 5 wherein said other electrode comprises a small-area wire and at least one closure member for one of said chambers comprising a large area metallic member adapted to promote the dissipation of heat.

12. A semiconductor device comprising a housing, a semiconductor crystal mounted within said housing, means in contact with said crystal dividing the surface area of said crystal and said housing into a plurality of discrete portions, at least one of said portions including a quantity of conductive fluid in rectifying contact with at least a portion of said surface area.

13. A semiconductor device comprising a housing having a resilient wall at one end thereof, a semiconductor body within said housing and dividing said housing into two chambers, one of said chambers including said resilient wall, a conductive fluid in said one chamber and in rectifying contact with said body whereby mechanical force applied to said wall alters the contact pressure of said fluid on said body.

14. A semiconductor photocell comprising a housing, a semiconductor crystal mounted within said housing and dividing said housing into two separate chambers, and a quantity of conductive fluid in one of said chambers and in rectifying contact with a surface portion of said crystal, the other of said chambers being adapted to receive radiation directed toward a surface area of said crystal.

References Cited in the file of this patent

UNITED STATES PATENTS

| | | |
|---|---|---|
| 1,797,587 | Peter | Mar. 24, 1931 |
| 1,994,632 | Becker | Mar. 19, 1935 |
| 2,524,033 | Bardeen | Oct. 3, 1950 |
| 2,524,034 | Brattain et al. | Oct. 3, 1950 |
| 2,627,545 | Muss et al. | Feb. 3, 1953 |
| 2,677,793 | Koury | May 4, 1954 |